United States Patent
Koo et al.

(10) Patent No.: US 11,538,696 B2
(45) Date of Patent: Dec. 27, 2022

(54) SEMICONDUCTOR PROCESSING APPARATUS AND SEALING DEVICE

(71) Applicant: XIA TAI XIN SEMICONDUCTOR (QING DAO) LTD., Qingdao (CN)

(72) Inventors: Deog-Ja Koo, Singapore (SG); Dea-Jin Kim, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 502 days.

(21) Appl. No.: 16/663,385

(22) Filed: Oct. 25, 2019

(65) Prior Publication Data
US 2021/0125844 A1 Apr. 29, 2021

(51) Int. Cl.
*H01L 21/67* (2006.01)
(52) U.S. Cl.
CPC .............................. *H01L 21/67017* (2013.01)
(58) Field of Classification Search
None
See application file for complete search history.

(56) References Cited

U.S. PATENT DOCUMENTS

| | | | | |
|---|---|---|---|---|
| 2001/0029891 | A1* | 10/2001 | Oh | C23C 16/452 118/722 |
| 2006/0112879 | A1* | 6/2006 | Lee | H01J 37/32935 118/713 |
| 2017/0338099 | A1* | 11/2017 | Miura | C23C 16/45551 |
| 2018/0294170 | A1* | 10/2018 | Zhao | H01L 21/67017 |
| 2021/0210339 | A1* | 7/2021 | Manna | H01L 21/0262 |

* cited by examiner

*Primary Examiner* — Ali Naraghi
(74) *Attorney, Agent, or Firm* — ScienBiziP, P.C.

(57) ABSTRACT

A chamber apparatus comprises a lower and an upper chamber body, and a gasket member. The lower chamber body defines a receiving region and a first receiving groove. The upper chamber body disposed above the lower chamber body and defines a second receiving groove projectively align to the first receiving groove. The second receiving groove is configured to establish sealing coupling with the lower chamber body so as to form a chamber enclosure region. The gasket member includes a conductive member and an elastomeric member. The conductive member configured to laterally surround the receiving region and respectively fit into the lower chamber body and the upper chamber body. The elastomeric member is protruded from the conductive member and extended toward the receiving region, configured to be compressed by the upper and the lower chamber body so as to seal the chamber enclosure region.

10 Claims, 6 Drawing Sheets

SEMICONDUCTOR PROCESSING APPARATUS AND SEALING DEVICE

FIELD

The present disclosure generally relates to apparatus for fabricating semiconductor device, more specifically to an apparatus having a processing chamber capable of establishing sealing enclosure through a sealing device.

BACKGROUND

Modern integrated circuits (IC) are fabricated with high device density, which typically include millions of components such as transistors, capacitors, resistors, and the like. The integration of greater circuit density calls for reduction of critical dimensions of integrated circuit components. Typically, integrated circuits are produced in large batches on a single wafer through semiconductor processes such as photolithography, deposition, exposure, etching, and polishing. Some of the processes may be operated in a chamber that is in a vacuum state and filled with plasma. On top of that, there is a need to maintaining the vacuum state and minimizing of plasma noise in a processing chamber of a semiconductor apparatus.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

It is to be noted, however, that the appended drawings illustrate only exemplary embodiments of this disclosure and are therefore not to be considered limiting of its scope, for the disclosure may admit to other equally effective embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the instant disclosure generally relate to an apparatus for processing a semiconductor substrate in a processing chamber that utilizes a lower chamber body and an upper chamber body configured to establish sealing coupling with the lower chamber body. Those skilled in the art will understand that embodiments of the instant disclosure may be applicable to semiconductor processing chamber where maintaining vacuum state and minimizing of plasma noise therein may improve yields, such as dry etching chambers, chemical vapor deposition (CVD) chambers, or sputter process chambers, and the like.

The description will be made as to the exemplary embodiments in conjunction with the accompanying drawings in FIGS. 1 to 6. Reference will be made to the drawing figures to describe the present disclosure in detail, wherein depicted elements are not necessarily shown to scale and wherein like or similar elements are designated by same or similar reference numeral through the several views and same or similar terminology.

Figure 1A:
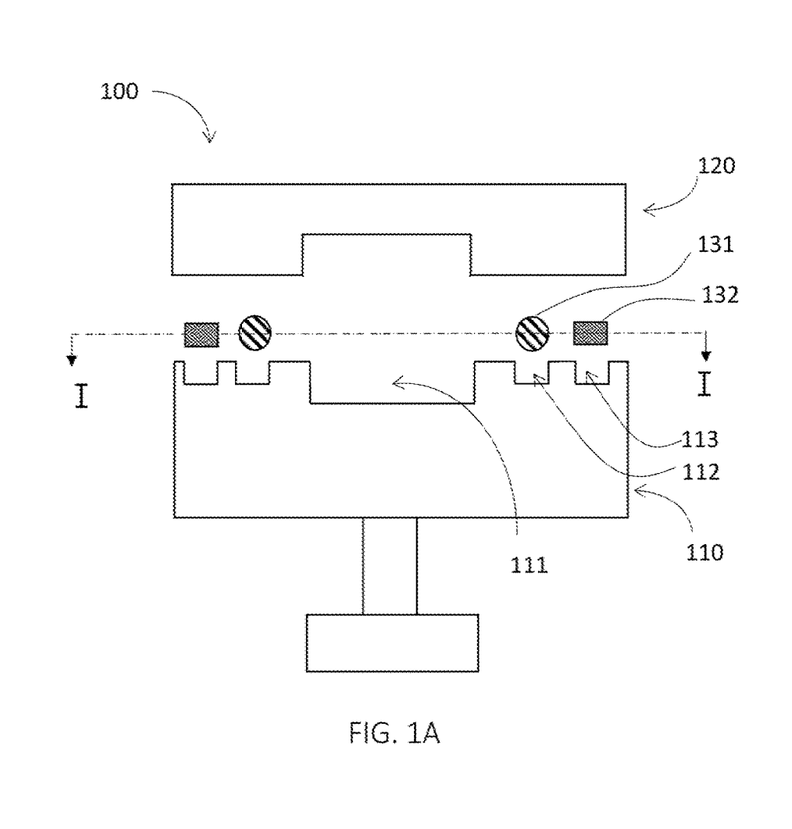
FIG. 1A illustrates a lateral cross-sectional view of a chamber apparatus in accordance with some embodiments of the instant disclosure.
Figure 1B:
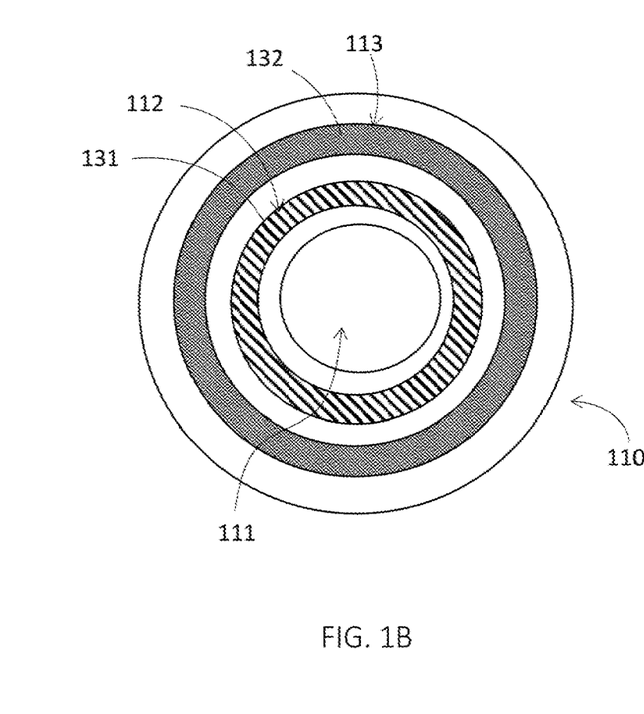
FIG. 1B illustrates a planar cross-sectional view taken along a horizontal plane that includes the I-I line as shown in FIG. 1A.

FIG. 1A illustrates a lateral cross-sectional view of a chamber apparatus 100 in accordance with some embodiments of the instant disclosure. FIG. 1B illustrates a planar cross-sectional view taken along a horizontal plane that includes the I-I line as shown in FIG. 1A.

A lower chamber body 110 has a central depression region that defines a receiving region 111. The lower chamber body 110 further possesses grooves 112, 113 that are laterally separated from each other and surrounding the receiving region 111. The grooves 112, 113 are respectively configured to receive an O-ring 131 and an electromagnetic compatibility (EMC) gasket 132.

An upper chamber body 120 is operably arranged above the lower chamber body 110 between an opened state and a closed state. When the upper chamber body 120 is in the closed state and pressed against the lower chamber body 110, the O-ring 131 is compressed and squeezed into the groove 112, such that an interior volume defined by the lower chamber body 110 and upper chamber body 120 can be sealed.

In some embodiments, the chamber apparatus 100 may be configured to perform etching. In such embodiments, the EMC gasket 132 that laterally surrounds the O-ring 131 can also shield the electromagnetic field inside the interior volume of the process chamber (e.g., chamber processing region 111).

In some scenarios, there may be needs to remove O-ring 131 from the groove 112. For example, upon multiple cycles of operations, the O-ring 131 may suffer plasma damage, or may be worn out from being repeatedly compressed. In addition, O-ring 131 may be removed to enable cleaning of process byproducts (e.g., particle residual such as polymer precipitation) in/around the groove 112 during equipment maintenance sessions. However, the removal of the O-ring 131 snug-fitted inside the groove 112 may result in scratches on surface that defines the groove 112. As an undesirable result, in subsequent processes, the scratched surfaces may leads to gas leakage (e.g., plasma leakage) from the interior volume. In some scenarios, scratched surfaces may further lead to RF leakage.

Figure 2A:
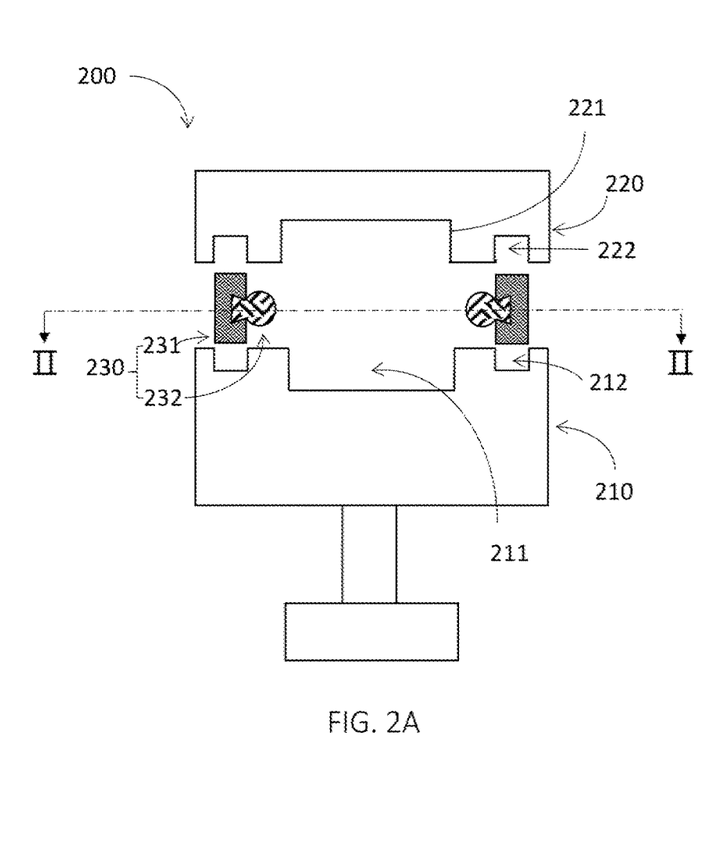
FIG. 2A illustrates a lateral cross-sectional view of a chamber apparatus in accordance with some embodiments of the instant disclosure.

FIG. 2A illustrates a lateral cross-sectional view of a chamber apparatus 200 in accordance with some embodiments of the instant disclosure.

In the chamber apparatus 200, an upper chamber body 220 is arranged above a lower chamber body 210. The lower chamber body 210 has a central depression region that defines a receiving region 211. In the embodiment illustrated in FIG. 2A, in addition to the receiving region 211 defined by the recessed cavity in the lower chamber body 210, the upper chamber body 220 is also provided with a correspondingly matching recessed region 221 that substantially aligns to the recessed cavity of the lower chamber body 210.

In some embodiments, the chamber apparatus 200 may be part of an etching system. In these embodiments, a substrate support pedestal (not shown) having an electrostatic chuck (ESC) for retaining a substrate during processing may be arranged in the receiving region 211 of the lower chamber body 210. In addition, a gas distribution plate may be arranged in the recessed region 221 above the substrate support pedestal for allowing downward gas flow (of process gas) over the substrate support pedestal.

In some embodiments, the chamber apparatus 200 may be part of a sputtering system. In these embodiments, the receiving region 211 of the lower chamber body 210 may accommodate a sputtering pedestal (not shown). In some embodiments, the recessed region 221 of the upper chamber body 220 may be used for accommodating a sputtering target.

In the exemplary embodiment, the lower chamber body 210 and the upper chamber body 220 further respectively defines a first receiving groove 212 and a second receiving groove 222. The first receiving groove 212 and the second receiving groove 222 may also be respectively referred to as lower annular recess (grove 212) and upper annular recess (groove 222). The first receiving groove 212 and second receiving groove 222 are projectively aligned to each other, and are configured to receive a sealing device 230.

In the embodiment illustrated in FIG. 2A, the first receiving groove 212 and the second receiving groove 222 may be of mirror symmetry with respect to a horizontal plane (not shown) defined between the lower chamber body 210 and the upper chamber body 220. Accordingly, a depth of the first receiving groove 212 in the lower chamber body 210 may be substantially identical to that of the second receiving groove 222 in the upper chamber body 220. In some embodiments, the depth of the first receiving groove 212 and the second receiving groove 222 may be, respectively, in a range from about 3 to 10 mm.

The sealing device 230 may also be referred to as gasket member, and is configured to be disposed between the lower chamber body 210 and the upper chamber body 220. The gasket member 230 includes a conductive member 231 and a elastomeric member 232 that protrudes from a surface of the conductive member 231. The profile of the conductive member 231 may match the cross sectional profile of the grooves 212, 222. The conductive member 231 is configured to fit into the first and the second receiving grooves 212, 222 such that the elastomeric member 232 (which is structurally integrated to the conductive member 231) extends toward the receiving region 211.

Figure 2B:
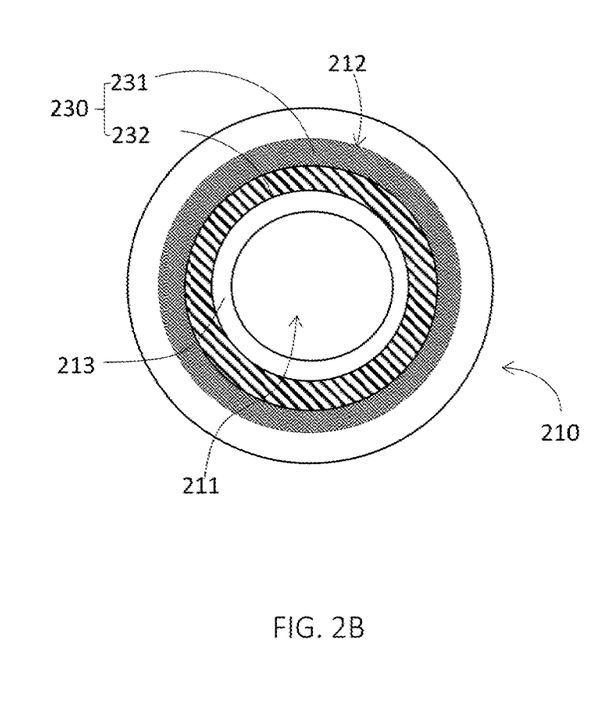
FIG. 2B illustrates a planar cross-sectional view taken along a horizontal plane that includes the II-II line as shown in FIG. 2A.

Referring to FIG. 2B, which illustrates a planar cross-sectional view taken along a horizontal plane that includes the I-I line as shown in FIG. 2A. The first receiving groove 212 laterally surrounds the receiving region 211. The gasket member 230 also laterally surrounds the receiving region 211 upon insertion of the conductive member 231 into the first receiving groove 212.

The conductive member 231 may also be referred to as an EMC gasket.

Figure 3:
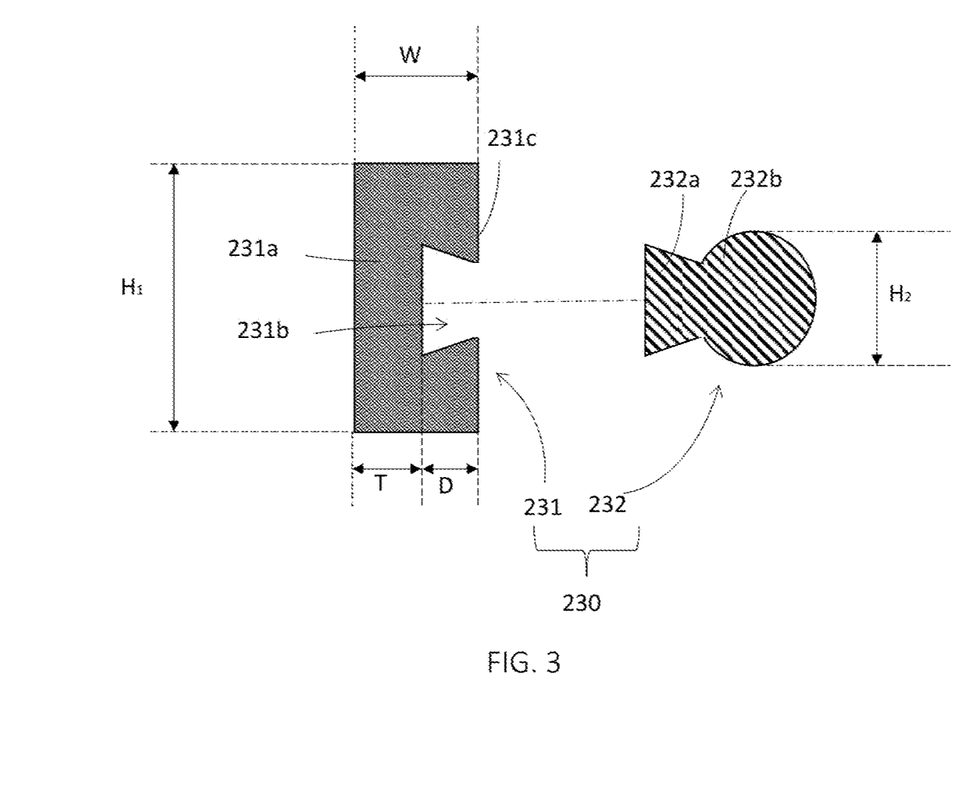
FIG. 3 illustrated a lateral cross-sectional view of a sealing device in accordance with some embodiments of the instant disclosure.

In the embodiment illustrated in FIG. 3, the conductive member 231 includes an engagement portion 231a configured to engage (i.e., mechanically couple to and retain) the elastomeric member 232. The engagement portion 231a may be located at the middle of the EMC gasket 231 in a height direction. The engagement portion 231a may include a mortise 231b to mate with a tenon formed on the elastomeric member 232. The mortise 231b may be defined at an inner sidewall surface of the conductive member 231 that faces toward the elastomeric member 232 and the receiving region 211 (shown in FIG. 2A) of the lower chamber body 210. In the embodiment illustrated in FIG. 3, the elastomeric member 232 includes a tenon 232a configured to be detachably mated with the mortise 231b of the gasket member 231. When the tenon 232a is attached to the mortise 231b, the conductive member 231 becomes structurally integrated with elastomeric member 232.

In some embodiments, the tenon 232a of the elastomeric member 232 may further be adhered to surface that defines the mortise 231b. In such embodiments, the tenon 232a may not detach from the mortise 231b.

The mortise 231b and the tenon 232a may include a dovetail profile. In addition, the profile of the protruded portion 232b of the elastomeric member 232 may be circular (e.g., round curved, circular, elliptical). In some embodiments, the profile of a protruded portion 232b can be geometric shapes such as rectangular or oval.

As shown in the cross section of the conductive member 231, a height $H_1$ of the conductive member 231 is larger than a width W of the conductive member 231. In some embodiments, a ratio between the width W and the height $H_1$ of the EMC gasket 231 may be 3:7.

When the lower chamber body 210 and the upper chamber body 220 are in the open state, the profile of the uncompressed elastomeric member 232 defines an height $H_2$ which may also referred to as uncompressed height. A ratio between the height $H_2$ of the elastomeric member 232 and the height $H_1$ of the EMC gasket 231 is smaller than 1. When the ratio ($H_2/H_1$) is not smaller than 1, the EMC gasket 231 might not be able to suitably insert into the first and the second receiving grooves 212, 222 of the upper and lower chamber body 210, 220. In some embodiments, the ratio ($H_2/H_1$) is in a range from about 0.2 to 0.8. In some embodiments, the range is from about 0.2 to 0.4.

In some embodiments, the materials of the EMC gasket 231 may be elastomers (e.g., foam) wrapped or plated with conductive material. In some embodiments, the EMC gasket 231 may comprise rigid metal that selectively comprise stainless steel (i.e. copper mix with nickel), copper, and chromium.

In some embodiments, the elastomeric member 232 may comprise rubber.

Rubber materials may selectively include fluorine rubber, fluoroelastomer, fluorinated rubber, fluorocarbon rubber, fluorine rubber. In some embodiments, elastomeric member 232 selectively comprises DuPont™ Kalrez® and DuPont™ Viton®.

It is worth mentioning that EMC gasket 231 made with rigid metal material may provide stronger structural engagement with the elastomeric member 232 than that made with flexible materials, such as foam. As such, the elastomeric member 232 may be less likely to detach from the EMC gasket 231.

Although not shown, the upper chamber body 220 may be coupled to a vertical adjustment mechanism (not shown) to enable vertical transition into a position that establishes sealing enclosure with the lower chamber body 210 (i.e., in the closed state).

Figure 4:
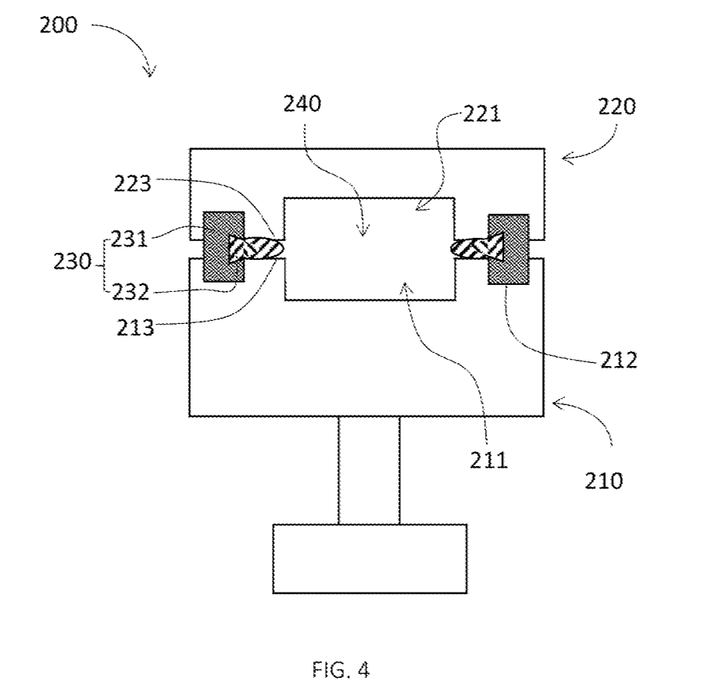
FIG. 4 illustrates a lateral cross-sectional view of a chamber apparatus that defines a chamber enclosure region in accordance with some embodiments of the instant disclosure.

FIG. 4 illustrates a lateral cross-sectional view of a chamber apparatus that defines a chamber enclosure region in accordance with some embodiments of the instant disclosure. Particularly, FIG. 4 provides a schematic illustration of the upper chamber body 220 and the lower chamber body 210 establishing sealing engagement in the closed position. The conductive member 231 is fitted into the respective grooves in the lower chamber body 210 and the upper chamber body 220. Upon closure of the upper and lower chamber bodies, the gasket member 230 may be compressed by the upper chamber body 220 and the lower chamber body 210 in order to achieve air-tight sealing. Meanwhile, the upper chamber body 220 establishes sealing coupling with the lower chamber body 210 so as to form a chamber enclosure region 240 at the receiving region 211. In the embodiment illustrated in FIG. 4, the chamber enclosure region 240 may be cooperatively defined by the recessed region 221 and the receiving region 211. Although not shown, a vacuum pump may be coupled to the chamber enclosure region for generating substantial vacuum condition in the chamber enclosure region 240.

In the embodiment illustrated in FIG. 4, the lower chamber body 210 further defines a lower annular clamping surface 213 (also shown in FIG. 2B) extending from the first receiving groove 212 towards the receiving region 211. The lower annular clamping surface 213 is configured to establish contact and support for the elastomeric member 232. Similarly, the upper chamber body 220 further includes an upper annular clamping surface 223 that is substantially in alignment with the lower annular clamping surface 213. The upper annular clamping surface 223 is configured to apply pressure and compress the elastomeric member 232.

Figure 5:
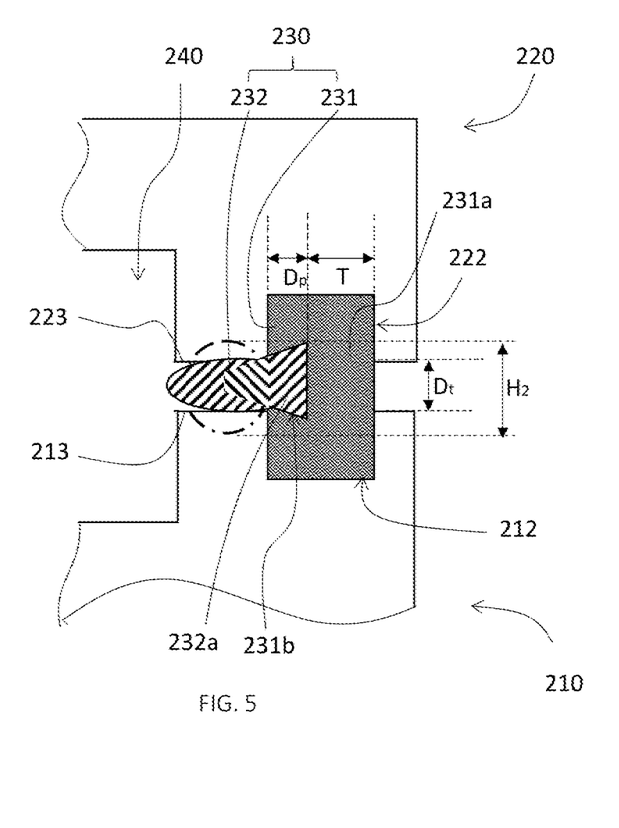
FIG. 5 illustrated a cross-sectional view of a sealing device upon compression in accordance with some embodiments of the instant disclosure.

FIG. 5 illustrated a cross-sectional view of a sealing device upon compression in accordance with some embodiments of the instant disclosure. Particularly, FIG. 5, provides a regional enlarged view that shows the elastomeric member 232 being compressed by the upper chamber body 220 and lower chamber body 210, e.g., upon closure of the upper chamber body 220 and the lower chamber body 210. In the exemplary schematic illustration, a profile of the dot-and-dash line represents a cross section profile of an uncompressed elastomeric member 232 (i.e., before deformation due to external pressure). Upon closure of the chamber bodies, the upper annular clamping surface 223 is separated from the lower clamping surface 213 by a predetermined distance $D_t$ (dictated by the thickness of the compressed elastomeric member 232). In some embodiments, a ratio between the predetermined distance a and the uncompressed height $H_2$ of the elastomeric member 232 is designed in a range from about 0.5 to 1. In some scenarios, when the ratio ($D_t/H_2$) is less than 0.5, the tenon 232a of the elastomeric member 232 may be overly deformed and prone to being pulled out from the mortise 231b in the conductive member 231. On the other hand, when the ratio ($D_t/H_2$) is greater than 1, the vacuum state of the 240 may not be securely maintained. In some embodiments, the ratio ($D_t/H_2$) may be 4:6.

The thickness T of the engagement portion 231a affects the Electromagnetic interference (EMI) shielding efficiency of the gasket. A greater the thickness T at the sidewall of the gasket may provide higher the EMI shielding efficiency. In some embodiments, the thickness T is larger than 2 mm. However, a mortise (e.g., mortise 231b) with too much depth $D_p$ may sacrifice the thickness T of the engagement portion 231a. In some embodiments, a ratio between the depth $D_p$ of mortise and the thickness T is in a range from about 0.8 to 1.4. In some embodiments, the ratio ($D_p/T$) is 1.

When the upper chamber body 220 disengages the lower chamber body 210 (e.g., transition from the closed state to an open position), an upper portion of the conductive member 231 is exposed from the retaining groove in the chamber body (e.g., second/upper groove 222). The exposed portion of the sealing device 230 may serve as a grip for the removal thereof from the first receiving groove 212. As the elastomeric member 232 is structurally integrated onto the conductive member 231, the flexible sealing ring (e.g., 232) and the rigid gasket (e.g., 231) may be removed together from the chamber body in a single operation. Moreover, as the elastomeric member 232 is not squeezed-fitted in a recess (as illustrated in the embodiment in FIG. 1A), the removal of the elastomeric member 232 may help to avoid scratch damage on the lower chamber body.

In some embodiments, the sealing device 230 can be made with a longer upper portion that serves as a grip for the removal, thus enabling easier removal of the sealing device 230. By ways of example, the conductive member 231 may be formed to have a longer upper portion configured to fit into the second receiving groove 222. In such embodiments, the depth of the second receiving groove 222 may be greater than that of the first receiving groove 212.

Figure 6:
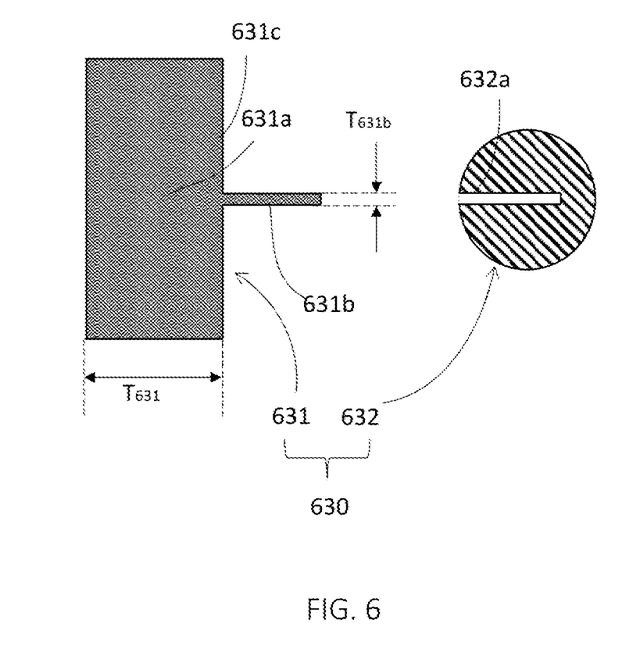
FIG. 6 illustrated a lateral cross-sectional view of a sealing device in accordance with some embodiments of the instant disclosure.

FIG. 6 illustrated a lateral cross-sectional view of a sealing device in accordance with some embodiments of the instant disclosure. Particularly, FIG. 6 shows a cross-sectional view of a sealing device 630 according to an embodiment of the instant disclosure. In the exemplary embodiment, an elastomeric member 632 having a mortise 632a formed therein facing an EMC gasket 631. An engagement portion (e.g., a protruding stud) 631b is provided on a surface of the EMC gasket 631. A tenon 631b (e.g., the engagement portion) is configured to detachably engage and retain the mortise 632a.

When the sealing device 630 is disposed in the first receiving groove 212 (shown in FIB. 2A and FIG. 2B) of the lower chamber body 210, the elastomeric member 632 is laterally surrounded by the EMC gasket 631. In such scenario, the tenon 631b of the conductive member 631 is protruding towards the receiving region 211 of the lower chamber body 210, and an outer sidewall surface of the elastomeric member 632 that defines the mortise 632a is facing to the conductive member 631.

In some scenarios, the tenon 631b may be damaged when the elastomeric member 632 is being compressed due to external force (e.g., from the clamping surfaces of the chamber bodies). The thickness $T_{631b}$ of the tenon 631b may be shortened to warrant sufficient cushioning/buffering from the elastomeric member 632 to prevent such damage. In some embodiments, the thickness $T_{631b}$ of the tenon 631b maybe within 1 mm.

In the embodiment illustrated in FIG. 6, instead of forming a mortise at the integrating portion 631a of the EMC gasket 631 (e.g., as illustrated in FIG. 5), the engaging portion 631a comprises a protruding tenon 631b, so that the thickness $T_{631}$ of the integrating portion 631a may be maintained. In such embodiment, the EMI shielding performance of the EMC gasket 631 may be further improved.

In some embodiments of instant disclosure, instead of utilizing tenon and mortice structures to integrate the elastomeric member and the gasket member, the elastomeric member may be coupled to a gasket member via adhesive.

One aspect of the instant disclosure provides a chamber apparatus comprises a lower chamber body, an upper chamber body, and a gasket member. The lower chamber body defines a receiving region and a first receiving groove. The upper chamber body disposed above the lower chamber body and defines a second receiving groove projectively align to the first receiving groove. The second receiving groove is configured to establish sealing coupling with the lower chamber body so as to form a chamber enclosure region at the receiving region. The gasket member configured to be disposed between the lower chamber body and the upper chamber body. The gasket member includes a conductive member and an elastomeric member. The conductive member configured to laterally surround the receiving region and respectively fit into the lower chamber body and the upper chamber body. The elastomeric member is protruded from the conductive member and extended toward the receiving region, configured to be compressed by the upper chamber body and the lower chamber body so as to seal the chamber enclosure region.

In some embodiments of the instant disclosure, in a cross section of the gasket member, the conductive member defines a mortise at an inner sidewall surface thereof that is facing the receiving region of the lower chamber body; the elastomeric member includes a tenon configured to be detachably mated with the mortise.

In some embodiments of the instant disclosure, in the cross section of the gasket member, a thickness of an integrating portion of the conductive member that defines the mortise is larger than 2 mm.

In some embodiments of the instant disclosure, in the cross section of the gasket member, a ratio between the thickness of the integrating portion of the conductive member that defines the mortise and a depth of the mortise is in a range from about 0.8 to 1.4.

In some embodiments of the instant disclosure, the integrating portion of the conductive member that defines the mortise is located at the middle of the conductive member.

In some embodiments of the instant disclosure, in the cross section of the gasket member, the tenon comprises a dovetail profile.

In some embodiments of the instant disclosure, in the cross section of the gasket member, a height of the conductive member is larger than a width of the conductive member.

In some embodiments of the instant disclosure, in a cross section of the gasket member, the elastomeric member defines a mortise at an outer sidewall surface thereof that is facing to the conductive member; the conductive member includes a tenon protruded towards the receiving region 211 of the lower chamber body 210 configured to detachably mated with the mortise.

In some embodiments of the instant disclosure, in a cross section of the apparatus, the elastomeric member includes a profile defining an uncompressed height; the lower chamber body further includes a lower annular clamping surface extending from the first receiving groove towards the receiving region, configured to support the elastomeric member; the upper chamber body further includes an upper annular clamping surface aligning with the lower annular clamping surface, configured to compress the elastomeric member and be separated from the lower clamping surface by a predetermined distance when the upper chamber body is assembled with the lower chamber body. A ratio between the predetermined distance and the uncompressed height of the elastomeric member is in a range from about 0.5 to 1.

In some embodiments of the instant disclosure, the first receiving groove of the lower chamber body and the second receiving groove of the upper chamber body has a mirror symmetry with respect to a horizontal plane defined between the lower chamber body and the upper chamber body.

One aspect of the instant disclosure provides a sealing device. The sealing device comprises an elastomeric member defining a first height in a cross section thereof, and an EMC gasket defining a second height in a cross section thereof. The EMC gasket includes an integrating portion configured to be integrated with the elastomeric member. A ratio between a first height of the elastomeric member and a second height of the EMC gasket is in a range from about 0.2 to 1.

In some embodiments of the instant disclosure, in a cross section of the EMC gasket, a thickness of the integrating portion of the EMC gasket is larger than 2 mm.

In some embodiments of the instant disclosure, in a cross section of the device, the integrating portion of the EMC gasket defines a mortise facing to the elastomeric member, wherein the integrating portion is located at the middle of the EMC gasket; the elastomeric member includes a tenon configured to detachably mated with the mortise.

In some embodiments of the instant disclosure, in the cross section of the EMC gasket, a ratio between the thickness of the integrating portion of the EMC gasket and a depth of the mortise is in a range from about 0.8 to 1.4.

In some embodiments of the instant disclosure, in the cross section of the EMC gasket, the tenon includes a dovetail profile.

In some embodiments of the instant disclosure, in a cross section of the device, the elastomeric member defines a mortise facing to the EMC gasket; the integrating portion of the EMC gasket defines a tenon configured to be detachably mated with the mortise.

In some embodiments of the instant disclosure, the elastomeric member comprises rubber. The EMC gasket comprises rigid metal.

In some embodiments of the instant disclosure, the elastomeric member coupled to the gasket member via adhesive.

One aspect of the instant disclosure provides an apparatus comprising a lower chamber body defining a receiving region and a lower annular recess surrounding the receiving region, and an upper chamber body disposed above the lower chamber body. The upper chamber body defines an upper annular recess projectively aligning with the lower annular recess, and configured to assemble with the lower chamber body so as to form a chamber enclosure region at the receiving region.

In some embodiments of the instant disclosure, in a cross of the apparatus, the lower annular recess of the lower chamber body and the upper annular recess of the upper chamber body has a mirror symmetry with respect to a horizontal plane defined between the lower chamber body and the upper chamber body.

The embodiments shown and described above are only examples. Many details are often found in the art such as the other features of a radiation measurement panel and device. Therefore, many such details are neither shown nor described. Even though numerous characteristics and advantages of the present technology have been set forth in the foregoing description, together with details of the structure and function, the disclosure is illustrative only, and changes may be made in the detail, especially in matters of shape, size, and arrangement of the parts within the principles, up to and including the full extent established by the broad general meaning of the terms used in the claims. It will therefore be appreciated that the embodiments described above may be modified within the scope of the claims.

What is claimed is:

1. A semiconductor processing apparatus, comprising:
a lower chamber body defining a receiving region and a first receiving groove;
an upper chamber body disposed above the lower chamber body defining a second receiving groove projectively align to the first receiving groove, configured to establish sealing coupling with the lower chamber body so as to form a chamber enclosure region at the receiving region; and
a gasket member configured to be disposed between the lower chamber body and the upper chamber body, the gasket member including:
a conductive member configured to laterally surround the receiving region and respectively fit into the lower chamber body and the upper chamber body, and
an elastomeric member protruded from the conductive member and extended toward the receiving region, configured to be compressed by the upper chamber body and the lower chamber body so as to seal the chamber enclosure region.

2. The apparatus of claim 1, wherein
in a cross section of the gasket member,
the conductive member defines a mortise at an inner sidewall surface thereof that is facing the receiving region of the lower chamber body; and
the elastomeric member includes a tenon configured to be detachably mated with the mortise.

3. The apparatus of claim 2, wherein
in the cross section of the gasket member, a thickness of an engagement portion of the conductive member that defines the mortise is larger than 2 mm.

4. The apparatus of claim 2, wherein
in the cross section of the gasket member, a ratio between the thickness of the engagement portion of the conductive member that defines the mortise and a depth of the mortise is in a range from about 0.8 to 1.4.

5. The apparatus of claim 2, wherein
the engagement portion of the conductive member that defines the mortise is located at the middle of the conductive member.

6. The apparatus of claim 2, wherein
in the cross section of the gasket member, the tenon comprises a dovetail profile.

7. The apparatus of claim 2, wherein
in the cross section of the gasket member, a height of the conductive member is larger than a width of the conductive member.

8. The apparatus of claim 1, wherein
in a cross section of the gasket member,
the elastomeric member defines a mortise at an outer sidewall surface thereof that is facing to the conductive member; and
the conductive member includes a tenon protruded towards the receiving region of the lower chamber body configured to detachably mated with the mortise.

9. The apparatus of claim 1, wherein in a cross section of the apparatus,
the elastomeric member includes a profile defining an uncompressed height;
the lower chamber body further includes
a lower annular clamping surface extending from the first receiving groove towards the receiving region, configured to support the elastomeric member;
the upper chamber body further includes
an upper annular clamping surface aligning with the lower annular clamping surface, configured to compress the elastomeric member and be separated from the lower clamping surface by a predetermined distance when the upper chamber body is assembled with the lower chamber body;
wherein a ratio between the predetermined distance and the uncompressed height of the elastomeric member is in a range from about 0.5 to 1.

10. The apparatus of claim 1, wherein in a cross section of the apparatus,
the first receiving groove of the lower chamber body and the second receiving groove of the upper chamber body having a minor symmetry with respect to a horizontal plane defined between the lower chamber body and the upper chamber body.

* * * * *